(12) United States Patent
Lu et al.

(10) Patent No.: US 11,991,875 B2
(45) Date of Patent: May 21, 2024

(54) SEMICONDUCTOR MEMORY STRUCTURE AND THE METHOD FOR FORMING THE SAME

(71) Applicant: Winbond Electronics Corp., Taichung (TW)

(72) Inventors: Chien-Ming Lu, Kaohsiung (TW); Po-Han Wu, Pingtung County (TW)

(73) Assignee: WINBOND ELECTRONICS CORP., Taichung (TW)

( * ) Notice: Subject to any disclaimer, the term of this patent is extended or adjusted under 35 U.S.C. 154(b) by 185 days.

(21) Appl. No.: 17/463,926

(22) Filed: Sep. 1, 2021

(65) Prior Publication Data

US 2023/0067536 A1 Mar. 2, 2023

(51) Int. Cl.
*H01L 27/108* (2006.01)
*H10B 12/00* (2023.01)

(52) U.S. Cl.
CPC ....... *H10B 12/315* (2023.02); *H10B 12/0335* (2023.02); *H10B 12/34* (2023.02); *H10B 12/482* (2023.02)

(58) Field of Classification Search
CPC H10B 12/315; H10B 12/482; H10B 12/0335; H10B 12/34
See application file for complete search history.

(56) References Cited

U.S. PATENT DOCUMENTS

| 10,475,794 | B1* | 11/2019 | Wu | H10B 12/485 |
| 10,559,570 | B2* | 2/2020 | Nagai | H10B 12/0335 |
| 2007/0121364 | A1 | 5/2007 | Bertin et al. | |
| 2015/0228574 | A1* | 8/2015 | Kim | H10B 12/482 |
| | | | | 257/773 |
| 2016/0267949 | A1* | 9/2016 | Han | H10B 12/485 |
| 2019/0221569 | A1* | 7/2019 | Nagai | H10B 12/315 |
| 2020/0152636 | A1* | 5/2020 | Nagai | H10B 12/485 |
| 2020/0273862 | A1* | 8/2020 | Wu | H10B 12/34 |

OTHER PUBLICATIONS

Huran et al., Hydrogenated Amorphous Silicon Carbon Nitridefilms Prepared by PECVD Technology: Properties, Journal of Electrical Engineering, vol. 63, No. 5, 2012, 333-335 (Year: 2012).*
Watanabe et al., High selectivity (SiN/SiO2) etching using an organic solution containing anhydrous HF, Microelectronic Engineering 86 (2009) 2161-2164 (Year: 2009).*
Pankratiev et al., Selective SiN/SiO2 etching by SF6/H2/Ar/He plasma, AIP Conference Proceedings 2179, 020017 (2019) (Year: 2019).*

* cited by examiner

*Primary Examiner* — Mary A Wilczewski
*Assistant Examiner* — Jaesun Lee
(74) *Attorney, Agent, or Firm* — Muncy, Geissler, Olds & Lowe, P.C.

(57) ABSTRACT

A semiconductor memory structure includes a substrate, a bit line disposed on the substrate, a dielectric liner disposed on a side of the bit line, and a capacitor contact and a filler disposed on the substrate. The bit line extends in a first direction. The dielectric liner includes a first nitride liner disposed on a sidewall of the bit line, an oxide liner disposed on a sidewall of the first nitride liner, and a second nitride liner disposed on a sidewall of the oxide liner. In a second direction perpendicular to the first direction, the capacitor contact is spaced apart from the bit line by the first nitride liner, the oxide liner, and the second nitride liner, and the width of the filler is greater than the width of the capacitor contact. A method for forming the semiconductor memory structure is also provided.

17 Claims, 7 Drawing Sheets

SEMICONDUCTOR MEMORY STRUCTURE AND THE METHOD FOR FORMING THE SAME

BACKGROUND

Technical Field

The present disclosure relates to a semiconductor memory structure, and in particular it relates to the capacitor contact of a dynamic random-access memory.

Description of the Related Art

Dynamic random access memory (DRAM) is widely used in consumer electronic products. In order to increase the density of elements in DRAM and improve their overall performance, there is currently an effort to scale down the size of the elements in the technique of fabricating a DRAM.

However, as elements continue to shrink, many challenges arise. For example, in the self-align etching process, materials in the corners are hard to clean. Thus, the subsequently formed capacitor contact is prone to short-circuiting in the corners. Therefore, the industry still needs to improve the DRAM and the method for fabricating the same in order to overcome the problems caused by scaling down the elements.

BRIEF SUMMARY

A semiconductor memory structure includes a substrate, a bit line disposed on the substrate, a dielectric liner disposed on a side of the bit line, a capacitor contact disposed on the substrate, and a filler disposed on the substrate. The bit line extends along a first direction. The dielectric liner includes a first nitride liner disposed on a sidewall of the bit line, an oxide liner disposed on a sidewall of the first nitride liner, and a second nitride liner disposed on a sidewall of the oxide liner. In a second direction perpendicular to the first direction, the capacitor contact is spaced apart from the bit line by the first nitride liner, the oxide liner, and the second nitride liner. In the second direction, the width of the filler is greater than the width of the capacitor contact.

A method for forming a semiconductor memory structure is provided. The method includes: providing a substrate; forming bit lines on the substrate; forming a dielectric liner on sidewalls of the bit lines; and forming a dielectric material layer between the bit lines. The bit lines extend in a first direction. The step of forming the dielectric liner includes: forming a first nitride liner on sidewalls of the bit lines; forming an oxide liner on sidewalls of the first nitride liner; and forming a second nitride liner on sidewalls of the oxide liner. The method further includes forming an opening in the dielectric material layer. Sidewalls of the opening expose a portion of the second nitride liner. The method further includes: along the sidewalls of the opening, laterally removing a portion of the second nitride liner until the oxide liner is exposed; forming a filler in the opening; and replacing the remaining dielectric material layer with a capacitor contact.

DETAILED DESCRIPTION

By removing a portion of the dielectric liner, the present disclosure may reduce the problem of short-circuits caused by the short distance between the capacitor contacts formed at the corners, thereby improving the performance of the semiconductor device.

In some embodiments, the semiconductor memory structure 10 is a portion of the DRAM array.

Figure 1:
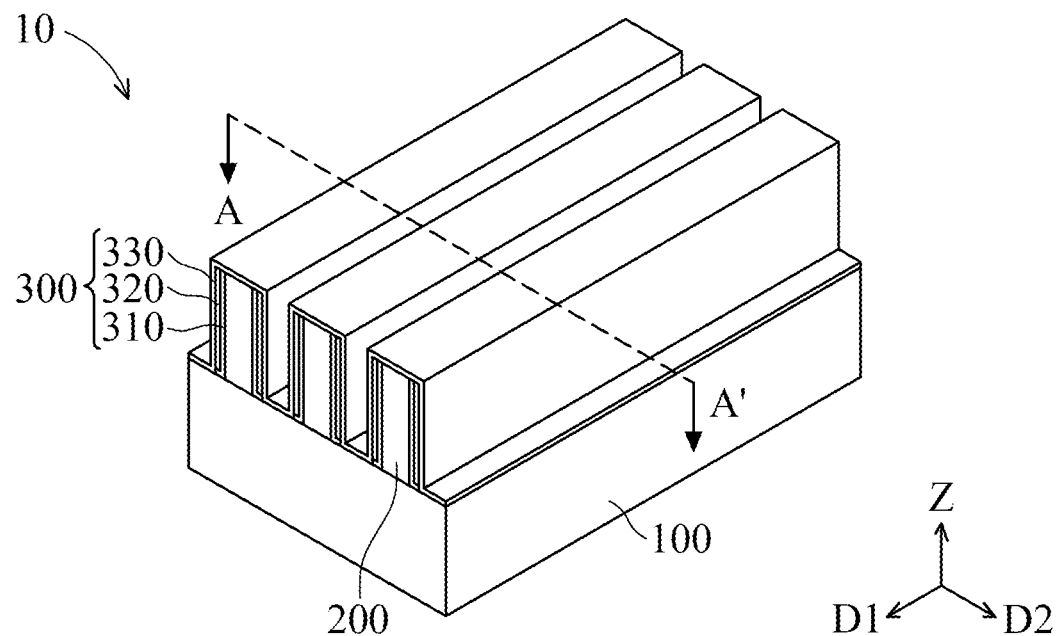
FIG. 1 illustrates a perspective view of forming a semiconductor memory structure according to some embodiments of the present disclosure.
Figure 2:
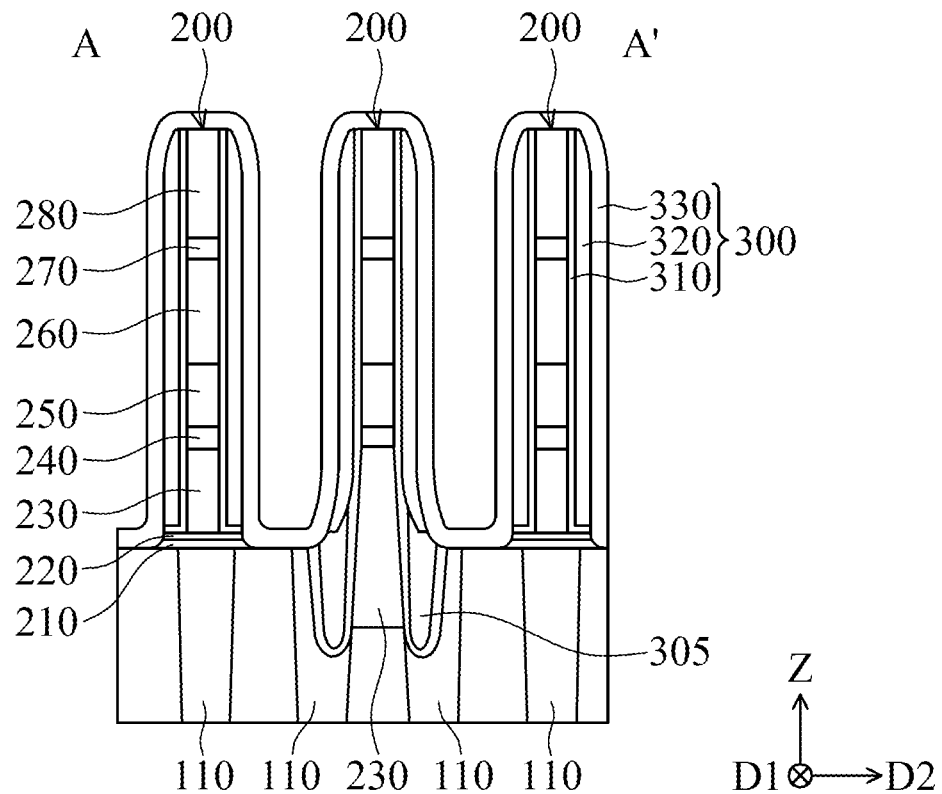
FIG. 2 illustrates a cross-sectional view of the semiconductor memory structure corresponding to cross-sectional line A-A' in FIG. 1 according to some embodiments of the present disclosure.

As shown in FIGS. 1-2, a substrate 100 is provided. In some embodiments, the substrate 100 may be an elemental semiconductor substrate, such as a silicon substrate or a germanium substrate; a compound semiconductor substrate, such as a silicon carbide substrate or a gallium arsenide substrate, or the like. In some embodiments, the substrate 100 may be a semiconductor-on-insulator (SOI) substrate.

As shown in FIG. 2, an isolation feature 110 is disposed in the substrate 100 to define an active region. The isolation feature 110 may include nitride or oxide, such as silicon oxide (SiO), silicon nitride (SiN), silicon oxynitride (SiON), and/or a combination thereof. The formation of the isolation feature 110 may include a patterning process (such as a lithography process and an etching process), a deposition process (such as chemical vapor deposition (CVD)), and a planarization process (such as chemical mechanical polishing (CMP)). In some embodiments, the etching process may include a dry etching process, such as reactive ion etching (RIE), neutral beam etch (NBE), inductive coupled plasma etch, suitable etching process, or a combination thereof.

In some embodiments, the word line (not shown) is further embedded in the substrate. In some embodiments, the word line serves as a gate, which includes a gate dielectric layer, a gate liner, and a gate electrode (not shown).

As shown in FIGS. 1-2, bit lines 200 are formed on the substrate 100. The bit lines 200 extend along a first direction D1. The bit line 200 includes conductive layers 230, 240, and 250, and dielectric layers 260, 270 and 280 thereon. The upper dielectric layers 260, 270 and 280 may be used to protect films underneath (such as the conductive layers 230, 240, and 250) from being damaged by the subsequent process.

In some embodiments, the conductive layers 230, 240, and 250 include doped polysilicon, metal, metal nitride, such as tungsten (W), titanium (Ti), and titanium nitride (TiN), and the like. In some embodiments, the dielectric layers 260, 270 and 280 include nitride or oxide, such as silicon nitride or silicon oxide or the like.

As shown in FIG. 2, the bit lines 200 disposed on the isolation feature 110 (or on the isolation region) further include cap layers 210 and 220. In a height direction Z, the cap layers 210 and 220 are disposed between the conductive layer 230 and the isolation feature 110. The cap layers 210 and 220 may include silicon oxide (such as thermal silicon oxide, or tetraethylorthosilicate (TEOS) oxide), silicon nitride (SiN) or silicon oxynitride (SiON). In some embodiments, the conductive layer 230 of the bit line 200, which is not disposed on the isolation feature 110, further extends into the substrate 100.

As shown in FIGS. 1-2, a dielectric liner 300 is formed on sidewalls of the bit lines 200. Specifically, the step of forming the dielectric liner 300 includes: conformally depositing a first nitride material layer (not shown) on sidewalls and the top surface of the bit lines 200 and on the substrate 100; conformally depositing an oxide material layer (not shown) on the first nitride material layer; removing the first nitride layer and the oxide layer on the top surface of the bit lines 200 and on the substrate 100 to form a first nitride liner 310 and an oxide liner 320; finally, conformally depositing a second nitride liner 330 on the top surface of the bit lines 200, on sidewalls of the oxide liner 320, and on the substrate 100.

In some embodiments, after forming the first nitride material layer, spacers 305 are formed on opposite sides of the conductive layers 230 in the substrate 100 to effectively isolate the conductive layer 230 from the subsequently formed capacitor contact thereby avoiding short-circuits.

In some embodiments, the first nitride liner 310 and the second nitride liner 330 include the same material, such as silicon nitride. The oxide liner 320 includes silicon oxide.

The oxide liner 320 is sandwiched between the first nitride liner 310 and the second nitride liner 330. In this way, the parasitic capacitance may be prevented from being generated between the bit lines 200 and the capacitor contact formed subsequently.

Figure 3:
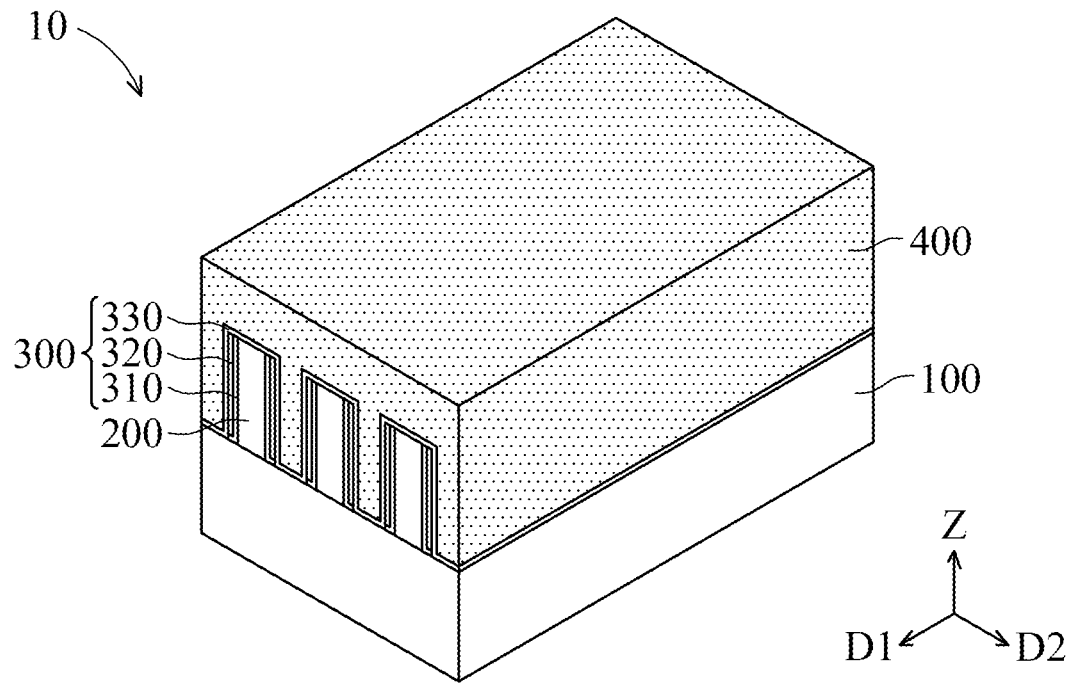
FIGS. 3-5 illustrate perspective views of forming a semiconductor memory structure at various stages according to some embodiments of the present disclosure.

As shown in FIG. 3, a dielectric material layer 400 is blanketly formed between the bit lines 200 and on the bit lines 200. Specifically, the dielectric material layer 400 is formed on the dielectric liner 300 and is completely filled into gaps between the bit lines 200.

In some embodiments, materials of the dielectric material layer 400 may include silicon oxide, silicon oxynitride, phosphosilicate glass (PSG), borophosphosilicate glass (BPSG), fluorinated silicate glass (FSG), organosilicate glass (OSG), $SiO_xC_y$, spin-on glass (SOG), low-k dielectric materials, other suitable materials, or the like. The formation of the dielectric material layer 400 may include a deposition process, such as chemical vapor deposition (CVD), physical vapor deposition (PVD), or atomic layer deposition (ALD) or the like.

Figure 4:
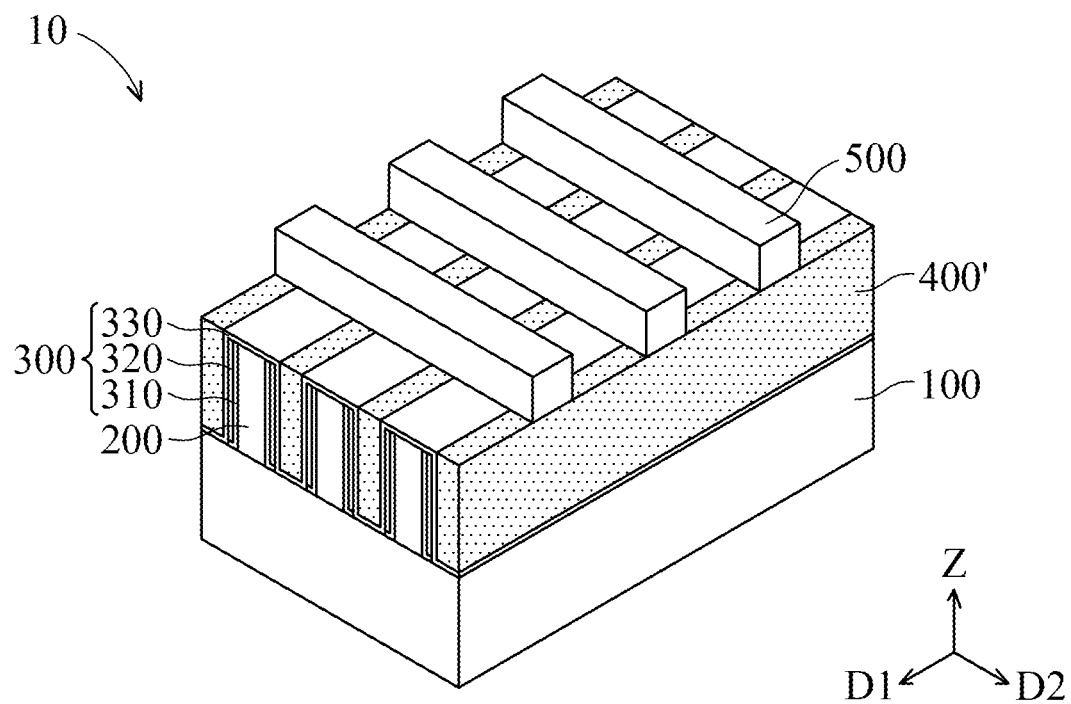

As shown in FIG. 4, a planarization process is performed to remove a portion of the dielectric material layer 400, so that the top surface of the remaining dielectric material layer 400' is level with the top surface of the dielectric liner 300 on the top surface of the bit lines 200. Next, in a second direction D2 perpendicular to the first direction D1, a strip-shaped photoresist 500 is formed at intervals on the top surface of the dielectric liner layer 300 and on the top surface of the remaining dielectric material layer 400'.

The planarization process may include a chemical mechanical polishing (CMP) or an etch-back process. The formation of the strip-shaped photoresist 500 may include a photolithography process, which includes photoresist coating, pre-exposure baking, exposure using a mask, development, and the like.

Figure 5:
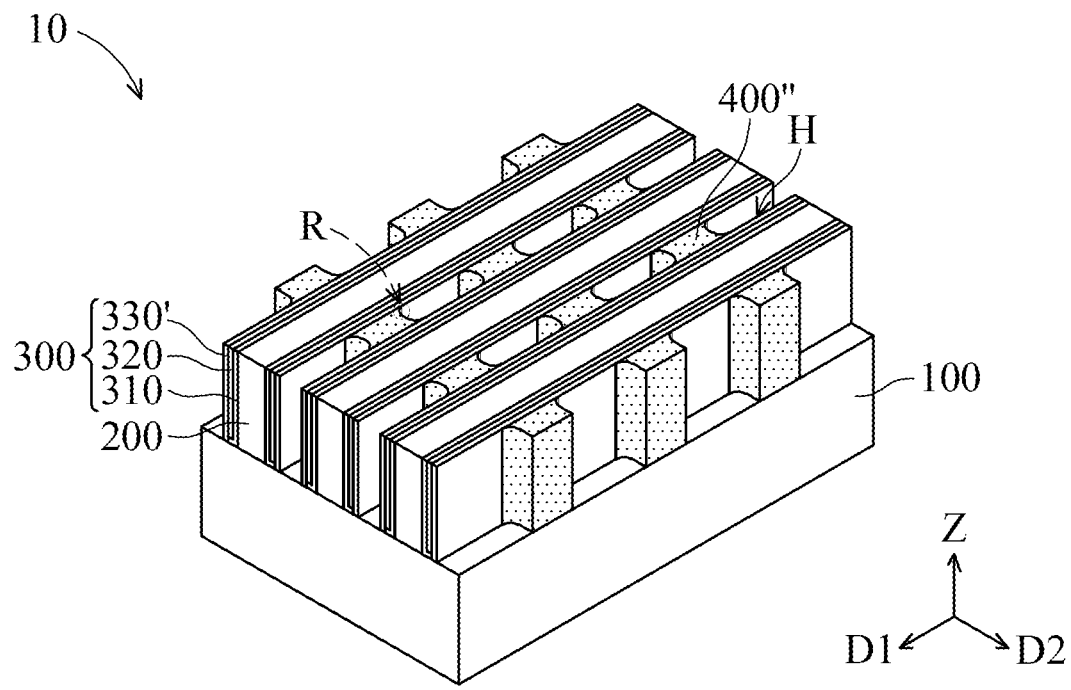
Figure 6:
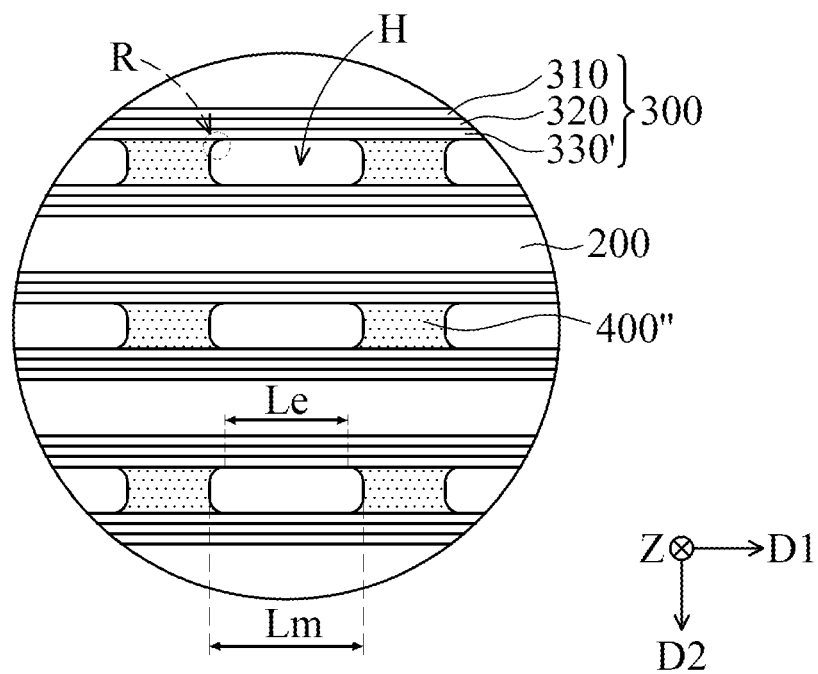
FIG. 6 illustrates a partial top view of the semiconductor memory structure corresponding to FIG. 5 according to some embodiments of the present disclosure.

As shown in FIGS. 5-6, a portion of the dielectric material layer 400' and a portion of the second nitride liner 330 are removed. Specifically, by the strip-shaped photoresist 500 used as an etching mask, the dielectric material layer 400' which is not disposed directly under the strip-shaped photoresist 500 is removed while the bit lines 200 and the dielectric liner 300 is substantially not removed. Then, an opening H is formed, and the dielectric material layer 400" which is disposed directly under the strip-shaped photoresist 500 is remaining. Next, the strip-shaped photoresist 500 is removed, and the second nitride liner 330 on the top surface of the bit lines 200 and on the substrate 100 is removed. In other words, only the second nitride liner 330' on sidewalls of the bit lines is remaining.

Here, "being substantially not removed" may include not removing/etching at all, slightly removing/etching (for example, compared to the target, it may be less than about 3% of the thickness of the target).

In some embodiments, sidewalls of the opening H expose a portion of the second nitride liner 330', and a bottom of the opening H exposes the substrate 100. In some embodiments, the opening H has a rounded corner R, which is located on the sidewalls of the second nitride liner 330'. In the first direction D1, the opening H and the dielectric material layer 400" are arranged alternately.

As shown in FIG. 6, the opening H is defined by the sidewalls of the dielectric liner 300 and the sidewalls of the dielectric material layer 400".

The removal of the portion of the dielectric material layer 400' may include an etching process, such as dry etching with etching selectivity. For example, an etching gas with a high carbon to fluorine ratio (such as $C_4F_8$) is used to achieve a high selectivity ratio of the dielectric material layer 400' to the bit lines 200 and the dielectric liner 300. In some embodiments, the ratio of the etching rate of the dielectric material layer 400' to the etching rate of the bit line 200 and the dielectric liner 300 is about 10:1-30:1, such as about 15:1-25:1.

The removal of the portion of the second nitride liner 330 may include an etching process, such as an anisotropic dry etching using a high hydrogen-containing gas (such as $CH_2F_2$). In this way, the second nitride liner 330 on the substrate 100 and on the top surface of the bit lines 200 is removed while the second nitride liner 330 on the sidewalls of the bit lines 200 is substantially not removed.

In some embodiments, in the height direction Z, the height of the bit line 200 may be substantially unchanged before and after the etching process for removing a portion of the second nitride liner 330. In other embodiments, in the height direction Z, the film in the upper bit line 200, such as the dielectric layer 280, may be partially removed due to the etching process of removing a portion of the second nitride liner 330. Thus, the height of the bit line 200 after the etching process is lower than the height before the etching process.

Since the etching process may not completely remove the dielectric material layer 400' which is not disposed directly under the strip-shaped photoresist 500 (for example, a portion of the dielectric material layer 400' desired to be removed may remain at the corners), the formed opening H has a rounded corner R. The opening H has a maximum width Lm in the first direction D1. However, due to the formation of the rounded corner, the width of the opening H near the bit line 200 is reduced to a width of Le (Le<Lm). In other words, the distance Lm between the two dielectric material layers 400" is reduced to the distance Le due to the rounded corners near the bit line 200.

Since the remaining dielectric material layer 400" will subsequently be replaced with capacitor contacts, and the distance between the dielectric material layers 400" is short, a short-circuit may occur as a result of the short distance between the capacitor contacts near the bit lines 200. The embodiment of the present invention will explain the means to solve the above-mentioned problems and overcome the problem of short-circuits in the capacitor contacts. Please refer to the following description for details.

Figure 7:
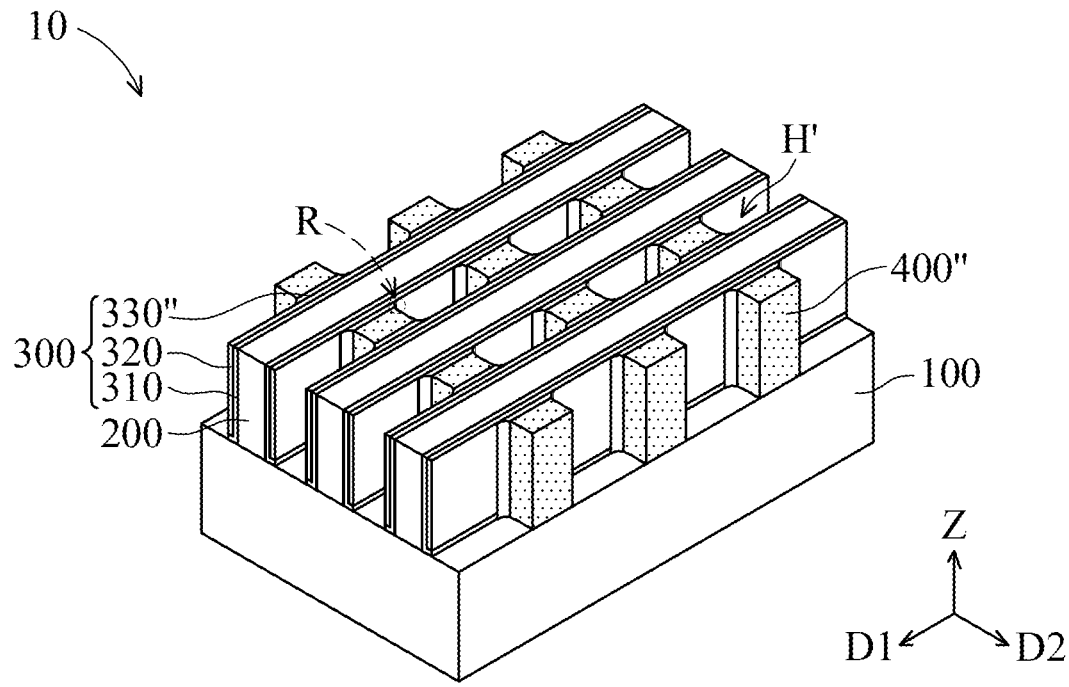
FIG. 7 illustrates a perspective view of forming a semiconductor memory structure according to some embodiments of the present disclosure.
Figure 8:
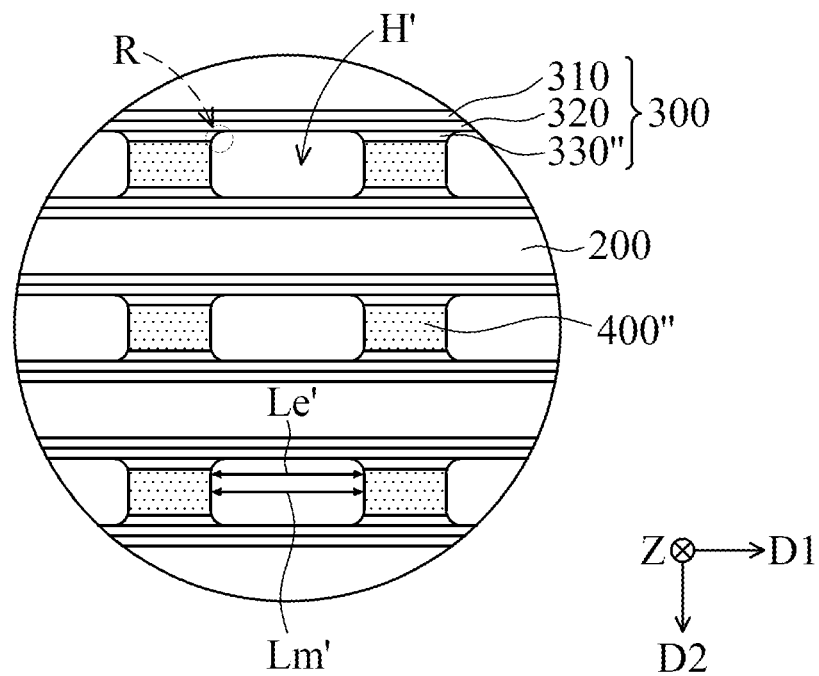
FIG. 8 illustrates a partial top view of the semiconductor memory structure corresponding to FIG. 7 according to some embodiments of the present disclosure.

As shown in FIGS. 7-8, along the sidewalls of the opening H, laterally removing a portion of the second nitride liner 330' until the oxide liner 320 is exposed. Thus, the second nitride liner 330" is disposed discontinuously. In some embodiments, the opening H is expanded along the second direction D2 while the opening H maintains the same width along the first direction D1 to form an opening H'. Compared to the opening H, the rounded corner R of the opening H' is more closer to the bit lines 200.

In some embodiments, the opening H' exposes the second nitride liner 330" and the oxide liner 320 at the same time. In the first direction D1 the second nitride liner 330" and the opening H' are arranged alternately.

In some embodiments, the removal of the portion of the second nitride liner 330' includes an etching process, such as isotropic dry etching with etching selectivity, to etch the second nitride liner 330 exposed on opposite sidewalls of the opening. For example, dry etching with a hydrogen-containing gas (such as $CH_2F_2$ or $CH_3F$) is used to achieve a high selectivity ratio of the second nitride liner 300' to the oxide liner 320. In some embodiments, the ratio of the etching rate of the second nitride liner 330' to the etching rate of the oxide liner layer 320 is about 25:1 or more, for example, about 25:1-40:1. In addition, in this embodiment, the oxide liner 320 may serve as an etch stop layer.

Figure 9:
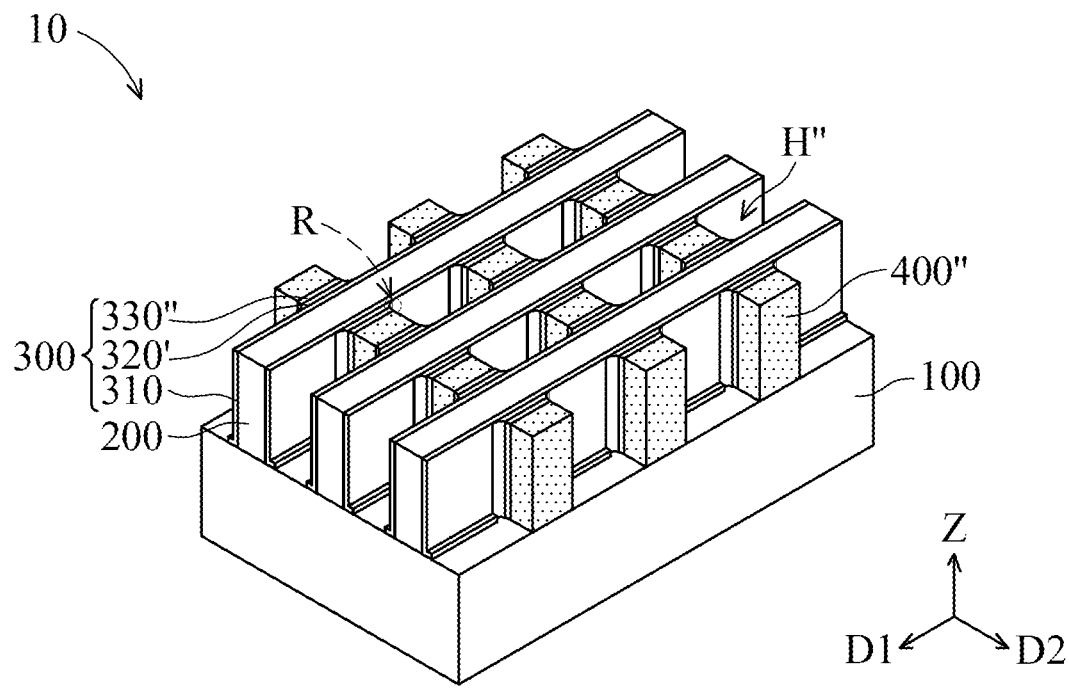
FIG. 9 illustrates a perspective view of forming a semiconductor memory structure according to some embodiments of the present disclosure.
Figure 10:
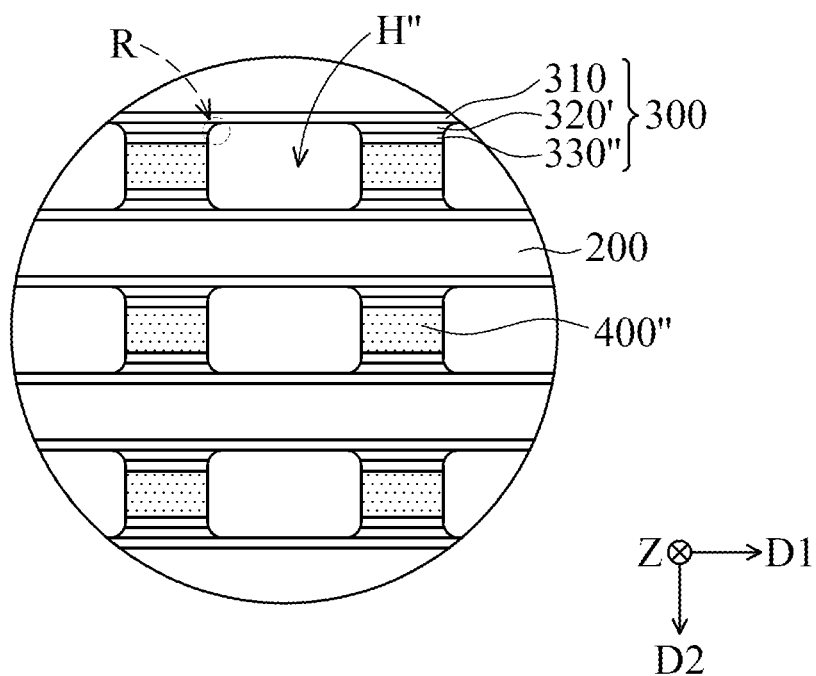
FIG. 10 illustrates a partial top view of the semiconductor memory structure corresponding to FIG. 9 according to some embodiments of the present disclosure.

As shown in FIGS. 9-10, along the sidewalls of the opening H', laterally removing a portion of the oxide liner 320 until the first nitride liner 310 is exposed. Thus, the oxide liner 320' is disposed discontinuously. In some embodiments, the opening H' is expanded along the second direction D2 while the opening H' maintain the same width along the first direction D1 to form an opening H". Compared to the opening H', the rounded corner R of the opening H" is more closer to the bit lines 200.

In some embodiments, the opening H" exposes the second nitride liner 330", the oxide liner layer 320', and the first nitride liner 310 at the same time. In the first direction D1, the oxide liner 320' and the opening H" are arranged alternately.

In some embodiments, the oxide liner 320' and the dielectric material layer 400" include the same material, such as silicon oxide. In this embodiment, since the thickness of the dielectric material layer 400" in the second direction D2 is much greater than that of the oxide liner 320', even if a portion of the oxide liner 320' is removed, the dielectric material layer 400" may substantially not be removed.

The removal of a portion of the oxide liner layer 320 includes an etching process, such as wet etching with etching selectivity, to etch the oxide liner layer 320 exposed on the opposite sidewalls of the opening. In addition, in this etching process, the first nitride liner layer 310 may be used as an etching stop layer.

In the embodiment where the wet etching is performed, an etchant may be used to control the etching selectivity. For example, the nitride may substantially not be etched while the oxide is etched. The etchant used in wet etching may include buffered oxide etch (BOE), diluted HF (DHF), and the like.

Since a portion of the second nitride liner 330' and a portion of the oxide liner 320 are removed, the rounded corner R advances from the center of the opening toward the bit lines 200 along the second direction D2. Thus, in the first direction D1, the distance between the two dielectric material layers 400" (which will be replaced by capacitor contacts in the subsequent process) may be maintained substantially the same (Le' is approximately equal to Lm') to avoid short-circuits caused by the subsequently formed capacitor contacts.

Figure 11:
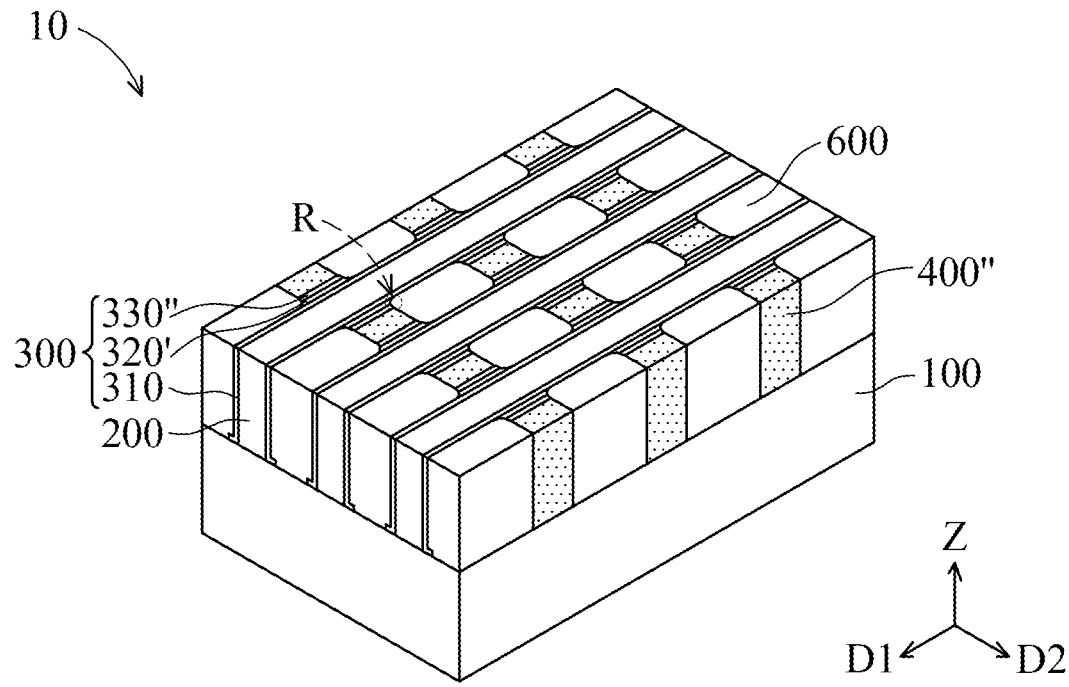
FIG. 11 illustrates a perspective view of forming a semiconductor memory structure according to some embodiments of the present disclosure.
Figure 12:
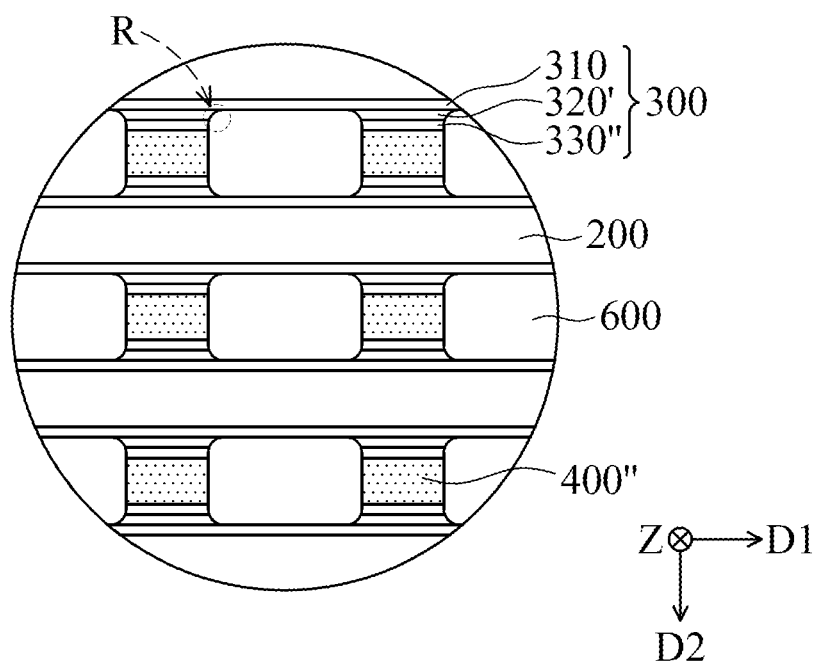
FIG. 12 illustrates a partial top view of the semiconductor memory structure corresponding to FIG. 11 according to some embodiments of the present disclosure.

As shown in FIGS. 11-12, a filler 600 is formed in the opening H". In some embodiments, the filler 600 may include nitride, such as silicon nitride, silicon oxynitride, or the like. The formation of the filler 600 includes depositing a filler material by a deposition process, and then removing excess filler material by a planarization process or an etching process, so that the top surface of the filler 600 is substantially level with the top surfaces of the bit lines 200. In some embodiments, the top surface of the filler 600, the top surfaces of the bit lines 200, and the top surface of the dielectric material layer 400" are substantially coplanar.

Since the filler 600 completely covers the opening H", the filler 600 also has a rounded corner R. In this embodiment, the rounded corner R is in direct contact with the dielectric liner 300. For example, the rounded corner R is in direct contact with the first and second nitride liners 310 and 330" and the oxide liner 320 at the same time.

In some embodiments, the filler 600 and the first nitride liner 310 include the same material, such as silicon nitride. In other words, there is no boundary line between the first nitride liner 310 and the filler 600. In the embodiment where the first nitride liner 310 and the filler 600 are both silicon nitride, in the second direction D2, the bit lines 200 and the silicon nitride are arranged alternately.

In some embodiments, the filler 600 and the dielectric material layer 400" include different materials. For example, the filler 600 includes silicon nitride and the dielectric material layer 400" include silicon oxide to facilitate selectively removing the dielectric material layer 400" subsequently.

Figure 13:
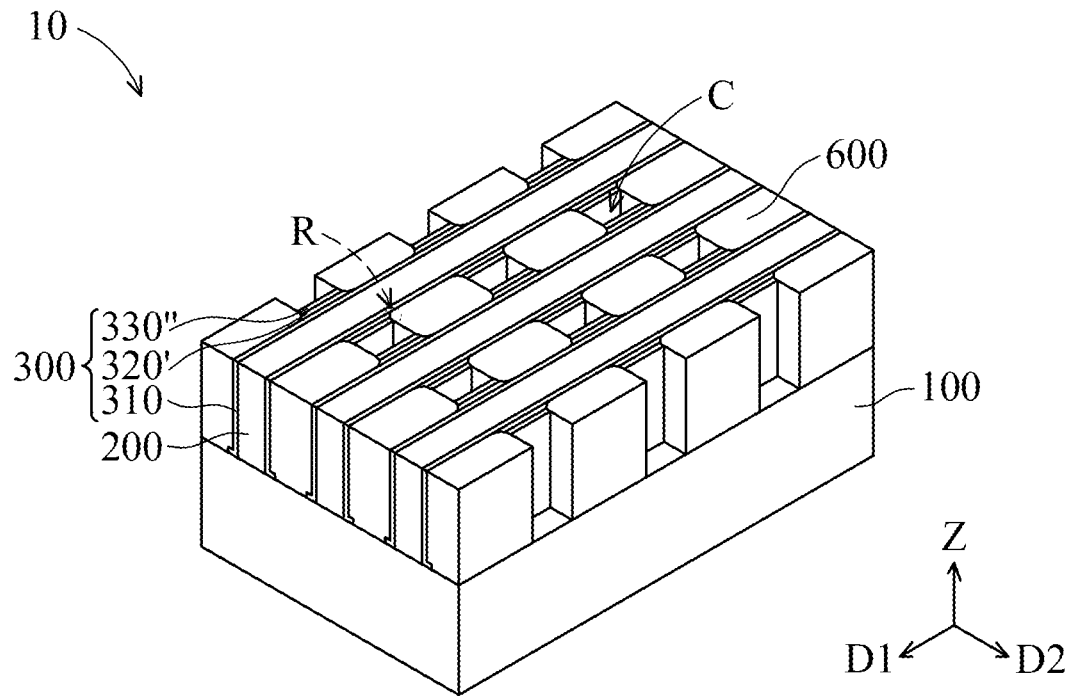
FIGS. 13-14 illustrate perspective views of forming a semiconductor memory structure at various stages according to some embodiments of the present disclosure.
Figure 14:
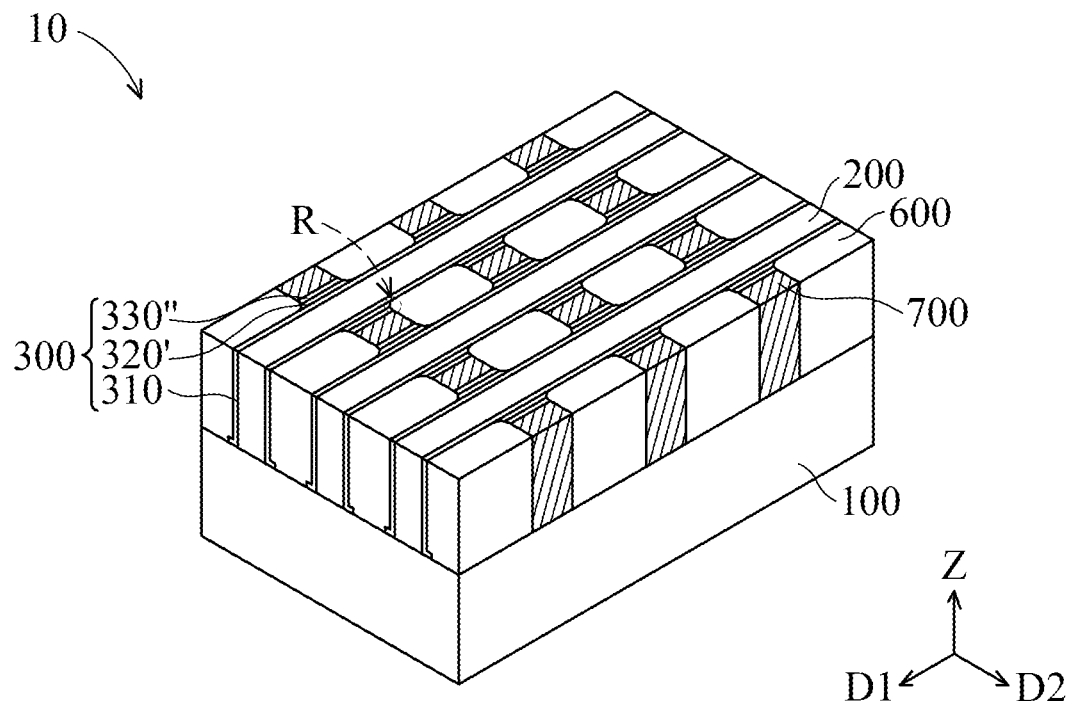

Next, referring to FIGS. 13-14, the dielectric material layer 400" is replaced with a capacitor contact 700. Specifically, the dielectric material layer 400" is completely removed to form a recess C; and the recess C is filled with a conductive material to form the capacitor contact 700.

In some embodiments, in the second direction D2, the capacitor contact 700 is spaced apart from the bit lines 200 by the first nitride liner 310, the oxide liner 320' the second nitride liner 330", and the filler 600 is spaced apart from the bit lines 200 only by the first nitride liner 310. In other words, in the second direction D2 between any two bit lines 200, the width of the filler 600 is greater than the width of the capacitor contact 700. In some embodiments, the second nitride liner 330 between the bit lines 200 and the filler 600 may be removed, so that the width of the filler 600 is greater than the width of the capacitor contact 700. In some embodiments, as long as the width of the filler 600 is greater than the width of the capacitor contact 700 in the second direction D2, the oxide liner 320 and/or the second nitride liner 330 may not be completely removed in the second direction D2 between any two bit lines 200.

In the embodiment of the present invention, a first nitride liner 310, an oxide liner 320', and a second nitride liner 330" are disposed between the capacitor contact 700 and the bit lines 200, and the first nitride liner 310 is disposed between the filler 600 and the bit lines 200. In this way, short-circuiting is reduced while the overall electrical properties are maintained.

In some embodiments, the rounded corner R of the filler 600 is in direct contact with the dielectric liner 300 and substantially does not directly contact the capacitor contact 700 to reduce the possibility of a short-circuit between any two capacitor contacts 700. In some embodiments, in the first direction D1, the capacitive contact 700 and the filler 600 are arranged alternately.

Compared with the case of not removing a portion of the nitride liner and the oxide liner, the step of removing a portion of the nitride liner and the oxide liner and advancing the rounded corner to the dielectric liner, which is provided by the embodiment of the present disclosure, may reduce the problem of short-circuits caused by the short distance between the two capacitor contacts near the bit lines.

The removal of the dielectric material layer 400" includes an etching process, such as wet etching with etching selectivity, to etch the dielectric material layer 400" until the sidewall of the filler 600 is completely exposed. In some embodiments, the recess C extends and exposes the top surface of the substrate 100 between the fillers 600.

In some embodiments, the etchant used for wet etching may include a buffered oxide etch (BOE) to completely remove the dielectric material layer 400" while substantially not removing the filler 600 and the dielectric liner 300.

In some embodiments, the conductive material may include doped polysilicon, metal, or metal silicide, or the like. The metal may include tungsten, aluminum, copper, gold, silver, the above alloys, or other suitable metal materials. The metal silicide may include cobalt silicide.

It should be noted that after the capacitor contact 700 is formed, additional components, such as capacitors, metal layers, dielectric layers, and the like, may still be formed to complete memory elements (such as DRAM).

In summary, by removing a portion of the nitride liner and the oxide liner layer in the embodiment of the present disclosure, the distance between the two capacitor contacts near the bit line may be increased, reducing the chance of a short-circuit.

Although the present invention is disclosed in the foregoing embodiments, it is not intended to limit the present invention. Those with ordinary skill in the technical field to which the present invention pertains can make some changes and modifications without departing from the spirit and scope of the present invention. Therefore, the scope of protection of the present invention shall be subject to those defined by the scope of the appended claims.

What is claimed is:

1. A semiconductor memory structure, comprising:
   a substrate;
   a bit line disposed on the substrate, wherein the bit line extends along a first direction;
   a dielectric liner disposed on a side of the bit line, wherein the dielectric liner comprises:
      a first nitride liner disposed on a sidewall of the bit line;
      an oxide liner disposed on a sidewall of the first nitride liner; and
      a second nitride liner disposed on a sidewall of the oxide liner, wherein in the first direction, the oxide liner and the second nitride liner are disposed discontinuously and the oxide liner is longer than the second nitride liner;
   a capacitor contact disposed on the substrate, wherein in a second direction perpendicular to the first direction, the capacitor contact is spaced apart from the bit line by the first nitride liner, the oxide liner, and the second nitride liner; and
   a filler disposed on the substrate, wherein in the second direction, a width of the filler is greater than a width of the capacitor contact, wherein in the second direction, a side of the filler is spaced apart from the bit line by the first nitride liner.

2. The semiconductor memory structure as claimed in claim 1, wherein in a top view, the filler has a rounded corner, and the rounded corner is in direct contact with the dielectric liner.

3. The semiconductor memory structure as claimed in claim 1, wherein in the first direction, the filler and the capacitor contact are arranged alternately.

4. The semiconductor memory structure as claimed in claim 2, wherein the rounded corner does not directly contact the capacitor contact.

5. A method for forming a semiconductor memory structure, comprising:
   providing a substrate;
   forming bit lines on the substrate, wherein the bit lines extend along a first direction;
   forming a dielectric liner on sidewalls of the bit lines, wherein the step of forming the dielectric liner comprises:
      forming a first nitride liner on sidewalls of the bit lines;
      forming an oxide liner on sidewalls of the first nitride liner; and
      forming a second nitride liner on sidewalls of the oxide liner;
   forming a dielectric material layer between the bit lines;
   forming an opening in the dielectric material layer, wherein sidewalls of the opening expose a portion of the second nitride liner;
   along the sidewalls of the opening, laterally removing a portion of the second nitride liner until the oxide liner is exposed;
   along the sidewalls of the opening, laterally removing a portion of the oxide liner until the first nitride liner is exposed after the step of laterally removing the portion of the second nitride liner, wherein in the first direction, the remaining second nitride liner and the remaining oxide liner are discontinuous and the remaining oxide liner is longer than the remaining second nitride liner;
   forming a filler in the opening; and
   replacing the remaining dielectric material layer with a capacitor contact.

6. The method as claimed in claim 5, wherein the step of laterally removing the portion of the second nitride liner comprises expanding the opening along a second direction perpendicular to the first direction.

7. The method as claimed in claim 5, wherein the step of forming the dielectric material layer comprises:
   depositing a dielectric material on the dielectric liner; and planarizing the dielectric material to form the dielectric material layer, wherein a top surface of the dielectric material layer is level with a top surface of the dielectric liner.

8. The method as claimed in claim 5, wherein the step of forming the second nitride liner comprises forming the second nitride liner on a top surface of the bit lines and on the substrate between the bit lines; and
wherein the step of forming the opening comprises removing the second nitride liner on the top surface of the bit lines and on the substrate between the bit lines to expose the substrate.

9. The method as claimed in claim 5, wherein the opening has a rounded corner.

10. The method as claimed in claim 5, wherein the step of laterally removing the portion of the second nitride liner comprises removing the portion of the second nitride liner by a dry etching process until the oxide liner is exposed; and
wherein the step of laterally removing the portion of the oxide liner comprises removing the portion of the oxide liner by a wet etching process until the first nitride liner is exposed.

11. The method as claimed in claim 5, wherein the step of replacing the remaining dielectric material layer with the capacitor contact comprises:
completely removing the remaining dielectric material layer to form a recess; and
filling the recess with a conductive material to form the capacitor contact.

12. The method as claimed in claim 5, wherein the step of forming the opening in the dielectric material layer comprises:
forming a strip-shaped photoresist on the dielectric material layer, wherein the strip-shaped photoresist extends along a second direction perpendicular to the first direction; and
removing the dielectric material layer which is not disposed directly under the strip-shaped photoresist.

13. The method as claimed in claim 5, wherein the dielectric material layer and the filler are formed of different materials.

14. The method as claimed in claim 5, wherein the dielectric material layer comprises spin on glass (SOG).

15. The method as claimed in claim 9, wherein the rounded corner is in direct contact with the oxide liner.

16. The method as claimed in claim 11, wherein the step of forming the recess comprises using a wet etching process comprising buffered oxide etch (BOE).

17. The method as claimed in claim 12, wherein the step of removing the dielectric material layer not disposed directly under the strip-shaped photoresist comprises selectively etching the dielectric material layer without etching the bit lines and the dielectric liner.

* * * * *